United States Patent [19]
Lin et al.

[11] Patent Number: 6,127,221
[45] Date of Patent: Oct. 3, 2000

[54] IN SITU, ONE STEP, FORMATION OF SELECTIVE HEMISPHERICAL GRAIN SILICON LAYER, AND A NITRIDE-OXIDE DIELECTRIC CAPACITOR LAYER, FOR A DRAM APPLICATION

[75] Inventors: Dahcheng Lin, Hsinchu; Jung-Ho Chang, Uen-Lin; Hsi-Chuan Chen, Tainan, all of Taiwan

[73] Assignee: Vanguard International Semiconductor Corporation, Hsin-Chu, Taiwan

[21] Appl. No.: 09/151,202

[22] Filed: Sep. 10, 1998

[51] Int. Cl.[7] .............................................. H01L 21/8242
[52] U.S. Cl. ..................... 438/255; 438/253; 438/254; 438/396; 438/238
[58] Field of Search ..................... 438/238, 239, 438/253, 254, 255, 281, 286, 398

[56] References Cited

U.S. PATENT DOCUMENTS

| | | | |
|---|---|---|---|
| 5,554,557 | 9/1996 | Koh | 437/52 |
| 5,597,754 | 1/1997 | Lou et al. | 438/398 |
| 5,597,756 | 1/1997 | Fazan et al. | 437/52 |
| 5,618,747 | 4/1997 | Lou | 438/398 |
| 5,639,685 | 6/1997 | Zahurak et al. | 437/60 |
| 5,650,351 | 7/1997 | Wu | 438/398 |
| 5,693,554 | 12/1997 | Lee | 438/396 |
| 5,696,014 | 12/1997 | Figura | 437/52 |
| 5,726,085 | 3/1998 | Crenshaw et al. | 438/255 |
| 5,753,558 | 5/1998 | Akram et al. | 438/386 |
| 5,792,688 | 8/1998 | Tseng | 438/253 |
| 5,804,481 | 9/1998 | Tseng | 438/255 |
| 5,817,554 | 10/1998 | Tseng | 438/238 |
| 5,837,582 | 10/1998 | Su | 438/255 |
| 5,858,838 | 1/1999 | Wang et al. | 438/255 |
| 5,899,716 | 4/1999 | Tseng | 438/254 |
| 5,913,119 | 6/1999 | Lin et al. | 438/255 |
| 5,926,719 | 7/1999 | Sung | 438/253 |
| 5,930,625 | 7/1999 | Lin et al. | 438/253 |
| 5,933,728 | 8/1999 | Sze | 438/255 |
| 5,976,945 | 10/1999 | Chi et al. | 438/386 |
| 5,989,969 | 10/1999 | Watanabe et al. | 438/381 |
| 6,015,733 | 1/2000 | Lee et al. | 438/253 |
| 6,037,219 | 3/2000 | Lin et al. | 438/255 |
| 6,037,220 | 3/2000 | Lin et al. | 438/255 |
| 6,046,082 | 4/2000 | Hirota | 428/255 |
| 6,046,093 | 4/2000 | DeBoer et al. | 438/398 |
| 6,057,205 | 5/2000 | Wu | 438/398 |

*Primary Examiner*—Brian Dutton
*Assistant Examiner*—Brook Kebede
*Attorney, Agent, or Firm*—George O. Saile; Stephen B. Ackerman

[57] ABSTRACT

A process for creating a DRAM capacitor structure, comprised of a storage node electrode, featuring an HSG silicon layer, on the surface of the storage node electrode, used to increase capacitor surface area, has been developed. The process features the use of a UHV system, allowing: a pre-clean procedure; an HSG seeding procedure; an anneal procedure used to create an HSG silicon layer; and a silicon nitride deposition; all to be performed in situ, without exposure to air, thus removing, and avoiding, unwanted native oxide layers. This invention allows a nitride—oxide, capacitor dielectric layer, to be formed in situ, in the UHV system, on an underlying storage node electrode structure, which in turn experienced in situ procedures, in the UHV system, resulting in HSG silicon layer, formed after an in situ, pre-clean, an HSG silicon seeding procedure, and an anneal procedure.

19 Claims, 4 Drawing Sheets

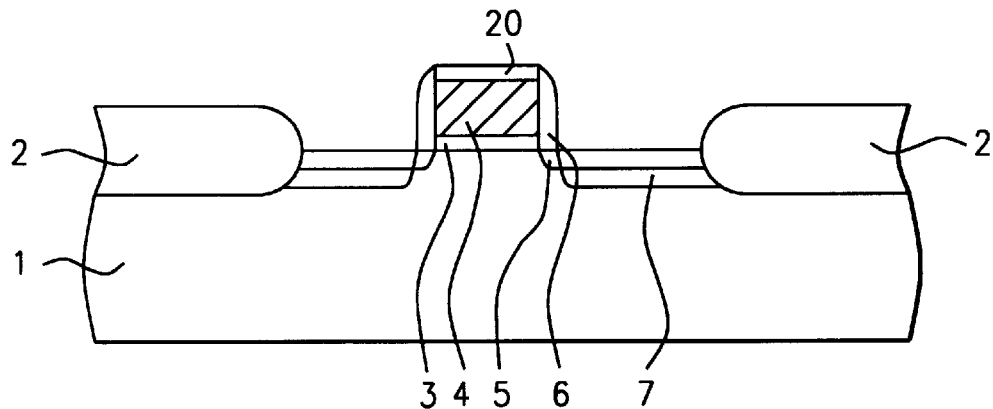
FIG. 1 – Prior Art
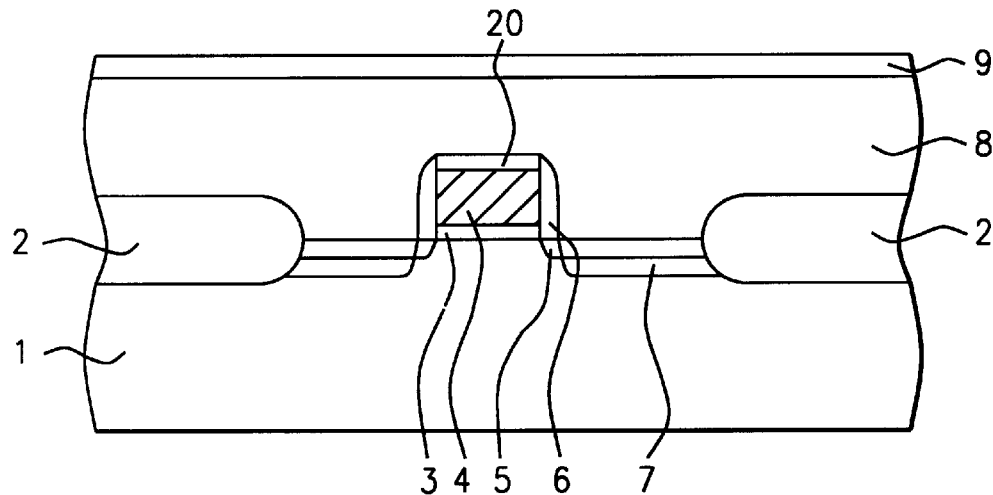
FIG. 2 – Prior Art
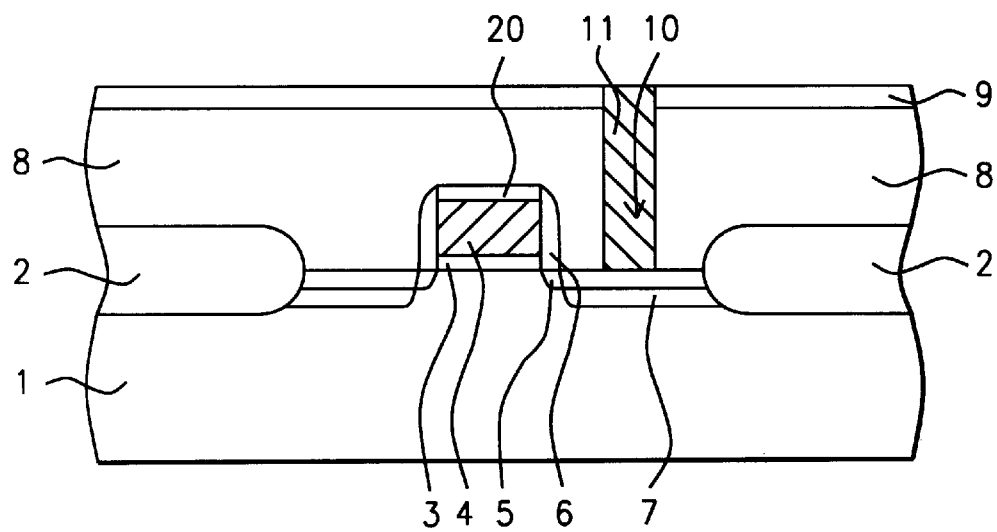
FIG. 3 – Prior Art

IN SITU, ONE STEP, FORMATION OF SELECTIVE HEMISPHERICAL GRAIN SILICON LAYER, AND A NITRIDE-OXIDE DIELECTRIC CAPACITOR LAYER, FOR A DRAM APPLICATION

BACKGROUND OF THE INVENTION (1) Field of the Invention

The present invention relates to a method used to fabricate a dynamic random access memory, (DRAM), device, and more specifically to a fabrication process used to selectively form components of a DRAM capacitor structure, in situ, using an ultra high vacuum, (UHV), system.

(2) Description of the Prior Art

Device performance and cost reductions are the major objectives of the semiconductor industry. These objectives have been in part realized by the ability of the semiconductor industry to produce chips with sub-micron features, or micro-miniaturization. Smaller features allow the reduction in performance degrading capacitances and resistances to be realized. In addition smaller features result in a smaller chip, however still possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source of a source/drain of the transfer gate transistor. However the decreasing size of the transfer gate transistor, limits the dimensions of the overlying STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of a giga bit per chip, or greater, has resulted in a specific cell design in which a smaller transfer gate transistor is being used, resulting in less of an overlying area for placement of overlying STC structures, and thus less storage node surface area.

The use of rough silicon, or hemispherical grain (HSG), silicon layers, as the surface layer of a DRAM capacitor, storage node electrode, where the HSG layer is comprised of convex and concave features, results in an increase in storage node surface area, when compared to counterparts fabricated with smooth silicon layers. This invention will describe a novel process in which the HSG silicon layer formation, comprised of a silicon seeding procedure, forming selectively only on exposed surfaces of an amorphous silicon storage node shape, and an anneal procedure, used to create the HSG silicon layer, from the silicon seeds, are performed in situ, in a ultra high vacuum, (UHV), system. This invention then describes the continuation of in situ procedures, performed in the UHV system, comprised of a silicon nitride layer deposition on the HSG silicon layer, followed by the oxidation of the silicon nitride layer, in another furnace, resulting in a nitride—oxide, (NO), capacitor dielectric layer, on the selectively formed HSG silicon layer. The use of the in situ processes, and UHV procedures, eliminate the formation of native oxide, that can grow on the surface of the HSG silicon layer, when using one system for the HSG silicon procedure, and a second system for the capacitor dielectric formation, thus eliminating the need for a pre-clean procedure, placed between these process steps. Prior art, such as Akram et al, in U.S. Pat. No. 5,753,558, as well as Zahurak et al, in U.S. Pat. No. 5,639,685, describe a UHV procedure, in the formation of HSG silicon layers, however these prior arts do not describe the in situ procedures for obtaining HSG silicon layers, and do not describe the nitride—oxide capacitor layers, created in situ, in a UHV system, in the present invention.

SUMMARY OF THE INVENTION

It is an object of this invention to create a DRAM capacitor structure, in which the surface area the storage node electrode, of the DRAM capacitor structure is increased, via use of an HSG silicon layer, selectively formed on a storage node shape.

It is another object of this invention to integrate the formation of an HSG silicon layer, on the storage node shape, and the formation of a capacitor dielectric layer, on the HSG silicon layer, via in situ deposition and anneal procedures, performed in an UHV system.

In accordance with the present invention, a method has been developed for creating a DRAM capacitor structure, in which the storage node structure is comprised of an HSG silicon layer, formed via selective silicon seeding, and anneal procedures, and followed by the in situ deposition of a silicon nitride layer, one of the capacitor dielectric layers, all performed in a UHV system. After creation of a storage node contact hole, formed in a composite insulator layer, comprised with an overlying layer of silicon nitride, a doped polysilicon plug is formed in a storage node contact hole, contacting the source region of an underlying transfer gate transistor. An amorphous silicon, storage node shape, is next formed on the top surface of the composite insulator layer, overlying, and contacting, the top surface of the doped polysilicon plug. After a pre-clean in a dilute hydrofluoric, (DHF), solution, and a high vacuum procedure, performed in a UHV system, hemispherical grain, (HSG), silicon seeds are selectively formed on all surfaces of the amorphous silicon, storage node structure, in situ, in an UHV system. An anneal procedure is next performed in situ, in the UHV system, resulting in the growth of an HSG silicon layer, initiated from the HSG silicon seeds. Without exposure to the environment, a silicon nitride layer is in situ deposited, in the UHV system, followed by an oxidation, of a top portion of the silicon nitride layer, performed in another furnace, creating a nitride—oxide, capacitor dielectric layer, on the HSG silicon layer, of the underlying storage node structure. The deposition and patterning of a polysilicon layer, results in the creation of the upper electrode, of the DRAM capacitor structure.

BRIEF DESCRIPTION OF THE DRAWINGS

The object and other advantages of this invention are best explained in the preferred embodiment with reference to the attached drawings that include:

FIGS. 1—9, which schematically, in cross-sectional style, show the key fabrication stages used in the creation of a DRAM capacitor structure, featuring a storage node structure, comprised of an HSG silicon layer, on an amorphous silicon shape, and an overlying nitride—oxide capacitor dielectric layer, and featuring the use of an UHV system, used to integrate, and to in situ form, the HSG silicon layer, and the capacitor dielectric layer.

DESCRIPTION OF THE PREFERRED EMBODIMENTS

Figure 4:
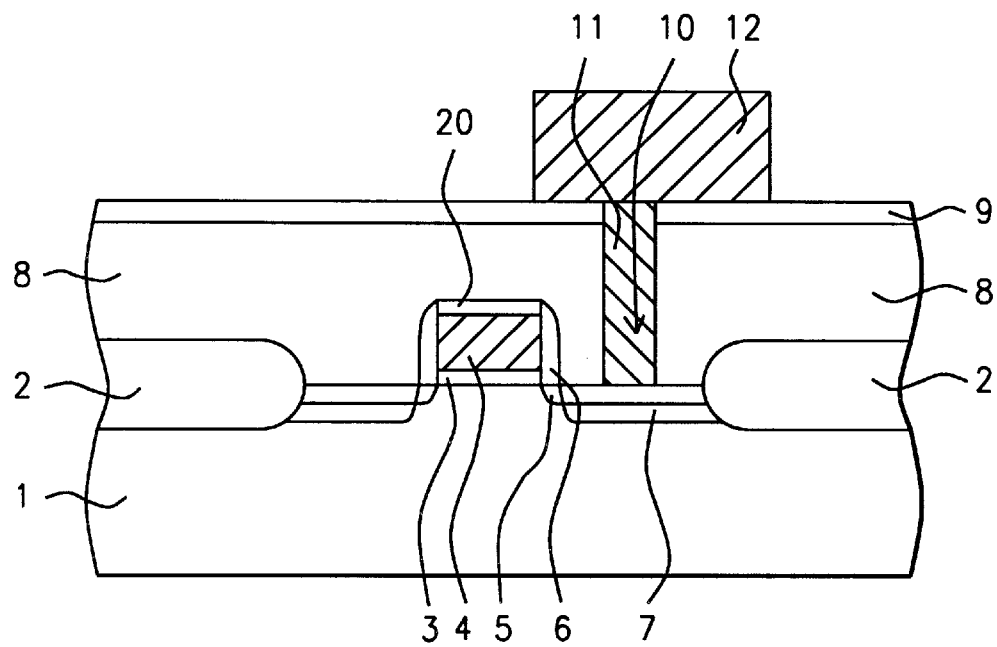

The method of forming a DRAM capacitor structure, wherein selective silicon seeding, and annealing, performed in a UHV system, used to create an HSG silicon layer, on an amorphous silicon, storage node shape, and followed by an in situ, deposition of a silicon nitride layer, and oxidation procedure, performed in the same UHV system, and used create a capacitor dielectric layer, on the HSG silicon layer, will now be described in detail. The transfer gate transistor, used for the DRAM device of this invention, will be an N channel device. However this invention, using an HSG silicon layer, and a nitride—oxide, (NO), capacitor dielectric layer, all formed in situ, in a UHV system, can also be applied to P channel, transfer gate transistor.

Referring to FIG. 1, a P type, semiconductor substrate 1, with a <100>, single crystalline orientation, is used. Field oxide, (FOX), regions 2, are used for purposes of isolation. Briefly the FOX regions 2, are formed via thermal oxidation, in an oxygen-steam ambient, at a temperature between about 750 to 1050° C., to a thickness between about 2000 to 5000 Angstroms. A patterned oxidation resistant mask of silicon nitride-silicon oxide is used to prevent FOX regions 2, from growing on areas of semiconductor substrate 1, to be used for subsequent device regions. After the growth of the FOX regions 2, the oxidation resistant mask is removed via use of a hot phosphoric acid solution for the overlying, silicon nitride layer, and a buffered hydrofluoric acid solution for the underlying silicon oxide layer. If desired, FOX regions 2, can be replaced by insulator filled shallow trenches. This can be accomplished via forming a trench, between about 2000 to 5000 Angstroms in depth, in semiconductor substrate 1, using anisotropic reactive ion etching, (RIE), procedure, using $Cl_2$ as an etchant. A silicon oxide layer, obtained using a low pressure chemical vapor deposition, (LPCVD), or a plasma enhanced chemical vapor deposition, (PECVD), procedure, is used to completely fill the shallow trenches. Unwanted silicon oxide is removed via a anisotropic RIE procedure, or via a chemical mechanical polishing, (CMP), procedure.

After a series of wet cleans, a gate insulator layer 3, comprised of silicon dioxide, is thermally grown in an oxygen-steam ambient, at a temperature between about 750 to 1050° C., to a thickness between about 40 to 200 Angstroms. A polysilicon layer 4, is next deposited using LPCVD procedures, at a temperature between about 500 to 700° C., to a thickness between about 500 to 4000 Angstroms. The polysilicon layer can either be grown intrinsically and doped via ion implantation of arsenic or phosphorous, or polysilicon layer 4, can be in situ doped during deposition via the incorporation of either arsine or phosphine to the silane, or disilane ambient. If lower word line, or gate resistance is desired, polysilicon layer 4, can be replaced by a polycide layer, comprised of a metal silicide layer, such as tungsten silicide or titanium silicide, residing on an underlying doped polysilicon layer. A silicon oxide layer 20, used as a cap insulator layer, is next grown via LPCVD or PECVD procedures, to a thickness between about 600 to 2000 Angstroms. Conventional photolithographic and reactive ion etching, (RIE), procedures, using $CHF_3$ as an etchant for silicon oxide layer 20, and using $Cl_2$ as an etchant for polysilicon or polycide layer 4, are used to create gate structure 6, with overlying cap insulator layer 20, shown schematically in FIG. 1. Photoresist removal is accomplished via plasma oxygen ashing and careful wet cleans.

A lightly doped source/drain region 5, is next formed via ion implantation of phosphorous, at an energy between about 5 to 60 KeV, at a dose between about 1E13 to 1E15 atoms/$cm^2$. Another silicon oxide layer is then deposited, using either LPCVD or PECVD procedures, at a temperature between about 400 to 850° C., to a thickness between about 1500 to 4000 Angstroms, followed by an anisotropic RIE procedure, using $CHF_3$ as an etchant, creating insulator spacers 6, located on the sides of polysilicon gate structure 4. A heavily doped source/drain region 7, is then formed via ion implantation of arsenic, at an energy between about 30 to 100 KeV, at a dose between about 1E14 to 5E16 atoms/$cm^2$. The result of these procedures are again schematically shown in FIG. 1.

An insulator layer 8, of either silicon oxide, or borophosphosilicate glass, (BPSG), is next deposited via LPCVD or PECVD procedures, to a thickness between about 1000 to 5000 Angstroms. A chemical mechanical polishing, (CMP), procedure is next used to planarize insulator layer 8. If a BPSG layer is used, a reflow procedure, performed at a temperature between about 700 to 1000° C., is employed to create a smoother the top surface topography for the BPSG layer. A silicon nitride layer 9, is next deposited, via LPCVD or PECVD procedures, to a thickness between about 50 to 1000 Angstroms. The result of these depositions is schematically shown in FIG. 2. Conventional photolithographic and RIE procedures, using $CF_4$ as an etchant for silicon nitride layer 9, and using $CHF_3$ as an etchant for silicon oxide layer 8, are used to open storage node contact hole 10, in the composite insulator layer, exposing the top surface of heavily doped source/drain region 7. Removal of the photoresist shape, used as an etch mask for the creation of storage node contact hole 10, is performed via use of plasma oxygen ashing and careful wet cleans. A polysilicon layer is next deposited, using LPCVD procedures, at a thickness between about 1000 to 6000 Angstroms. The polysilicon layer is in situ doped, during deposition, via the addition of arsine, or phosphine, to a silane, or disilane ambient, resulting in a bulk concentration for the polysilicon layer, between about 1E19 to 2E20 atoms/$cm^3$. The formation of doped polysilicon plug 11, in storage node contact hole 10, shown schematically in FIG. 3, is accomplished via removal of unwanted regions of polysilicon, from the top surface of silicon nitride layer 9, using either an anisotropic RIE procedure, using $Cl_2$ as an etchant, or using a CMP procedure.

An amorphous silicon layer 12, is next deposited, via LPCVD procedures, at a temperature below 550° C., to a thickness between about 4000 to 15000 Angstroms, and in situ doped, during deposition, via the addition of the addition of arsine or phosphine, to a silane, or a to a disilane ambient, resulting in a bulk concentration less than 6E20 atoms/$cm^3$. A photoresist shape is then used as an etch mask, allowing storage node shape 12, to be patterned, via an anisotropic RIE procedure, using $Cl_2$ as an etchant. Storage node shape 12, shown schematically in FIG. 4, overlying, and contacting doped polysilicon plug 11, formed from an amorphous silicon layer can also be obtained from a polysilicon layer. The photoresist shape, used for patterning of storage node shape 12, is removed via plasma oxygen ashing and careful wet cleans.

Figure 5:
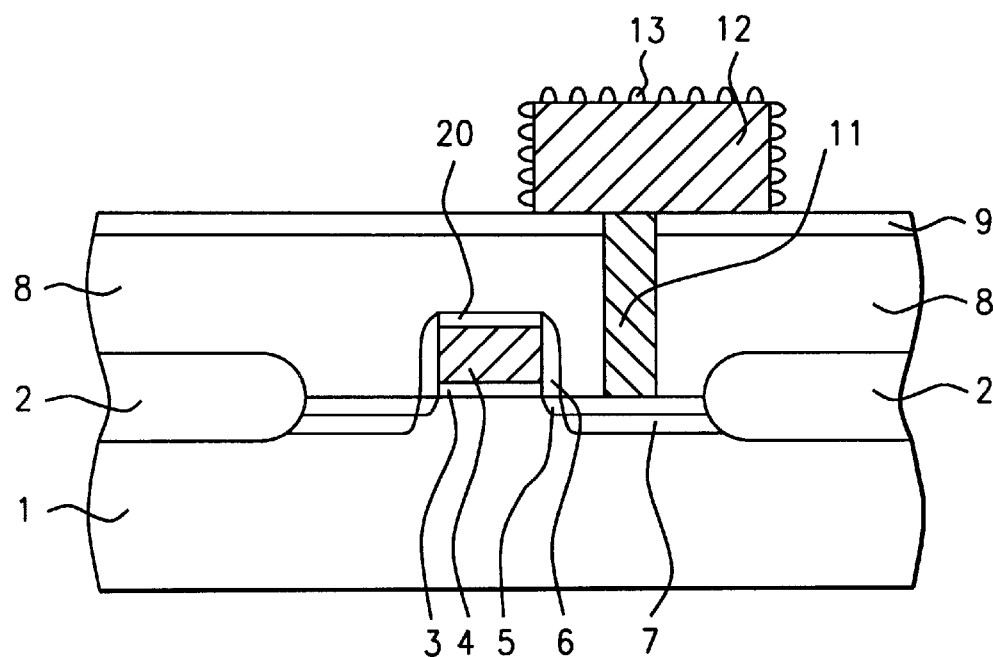
Figure 6:
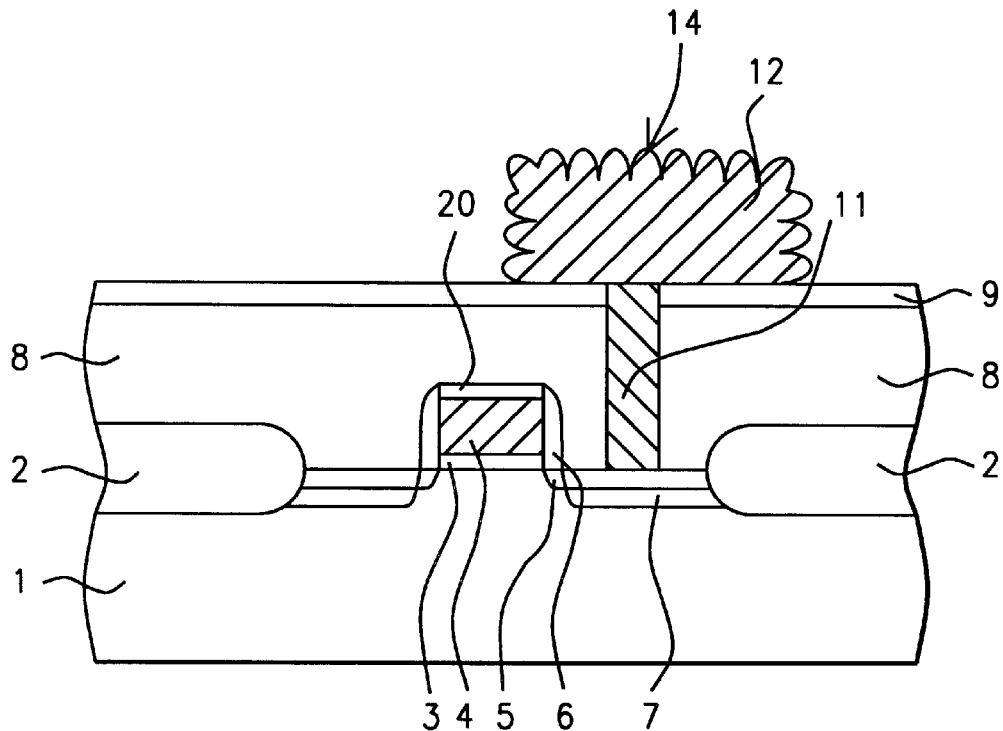

FIG. 5, schematically shows the result of the selective growth of HSG silicon seeds 13, on exposed surfaces of storage node shape 12. First a DHF pre-clean is used to remove any existing native oxide from the surface of storage node shape 12. After the DHF pre-clean, samples are placed in a ultra high vacuum, (UHV), system, at a temperature between about 500 to 800° C., at a pressure less than 1.0 torr, for a time between about 1 to 60 min., and using a silane, or a disilane flow concentration below 1.0E-3 moles/m³. These conditions allowed the growth of HSG silicon seeds 13, to selectively formed only on storage node shape 12, not on silicon nitride layer 9. In addition, prior to the deposition of HSG silicon seeds 13, the pressure in the UHV system is decreased, or the vacuum is increased to a level below 1E-8 torr, and the storage node shape 12, is held at a temperature between about 500 to 800° C., for a time between about 1 to 60 min, to remove any remaining native oxide layer, that may be present on the surfaces of storage node shape 12, after the DHF pre-clean procedure, thus allowing HSG silicon seeds 13, to be deposited in situ, on an oxide free, amorphous silicon surface. A critical anneal cycle is next performed, in situ, in the same UHV system, at a temperature between about 500 to 800° C., at a pressure of about 1E-8 torr, for a time between about 0 to 120 min., resulting in the formation of HSG silicon layer 14, on storage node shape 12. This is schematically shown in FIG. 6. The anneal procedure allows the formation of HSG silicon layer 14.

Figure 7:
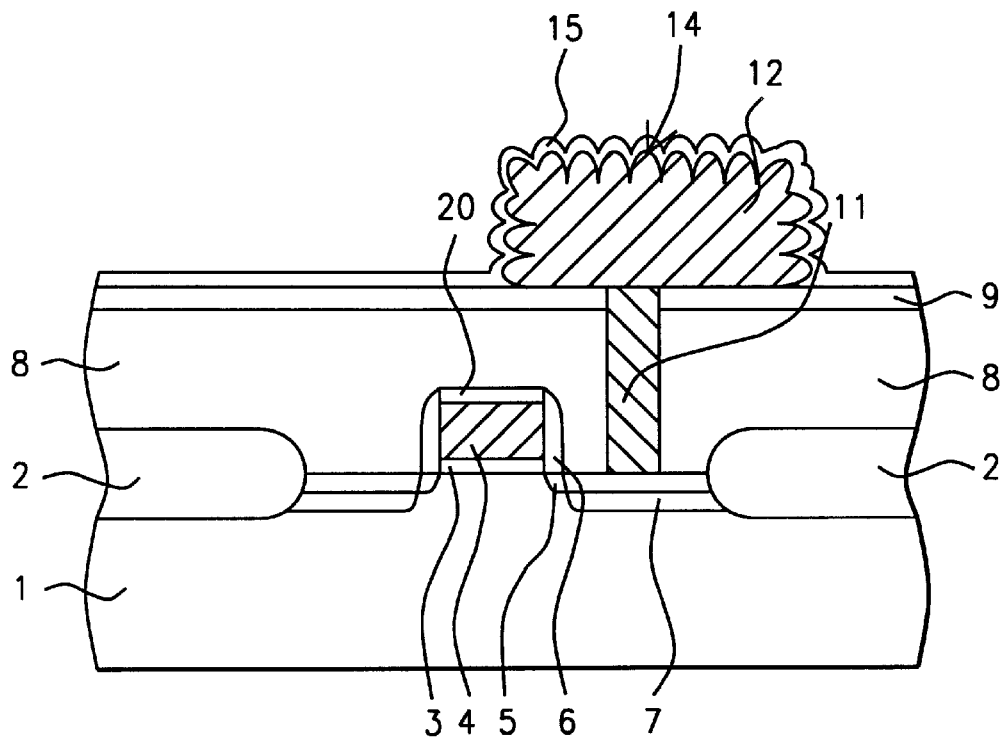
Figure 8:
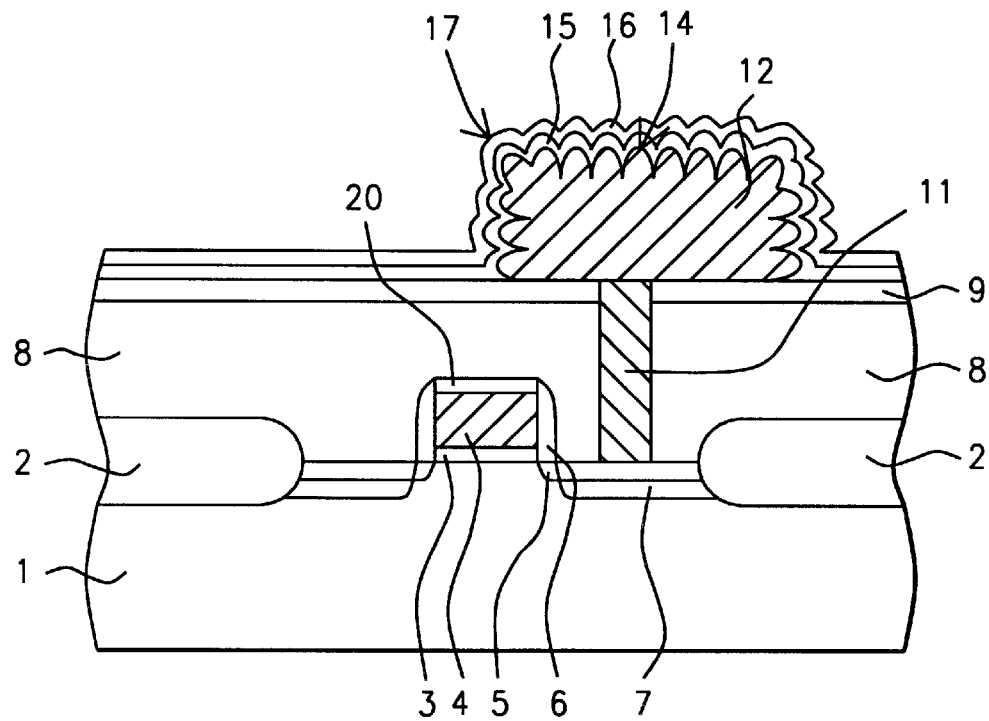

The creation of the capacitor dielectric layer, is next formed, again using in situ procedures, in the UHV system. First a silicon nitride layer 15, shown schematically in FIG. 7, is deposited on the surface of HSG silicon layer 14, in the UHV system, at a temperature between about 600 to 800° C., to a thickness between about 40 to 60 Angstroms. Since the silicon nitride layer is deposited on HSG silicon layer 14, in situ, in the UHV system, without exposure to the environment, native oxide is not present between these layers. Next an oxidation procedure, performed, in a different system, at a temperature between about 700 to 1000° C., in an oxygen—water vapor ambient, is used to convert a top portion of silicon nitride layer 15, to silicon oxide layer 16. The capacitor dielectric layer 17, comprised of overlying silicon oxide layer 16, at a thickness between about 5 to 30 Angstroms, and overlying silicon nitride layer 15, now at a thickness between about 20 to 40 Angstroms, is schematically shown in FIG. 8. A capacitor dielectric layer of $Ta_2O_5$ can be used if desired, obtained in situ, in the UHV system, via in situ deposition of tantalum, followed by an oxidation procedure, performed in a different system.

Figure 9:
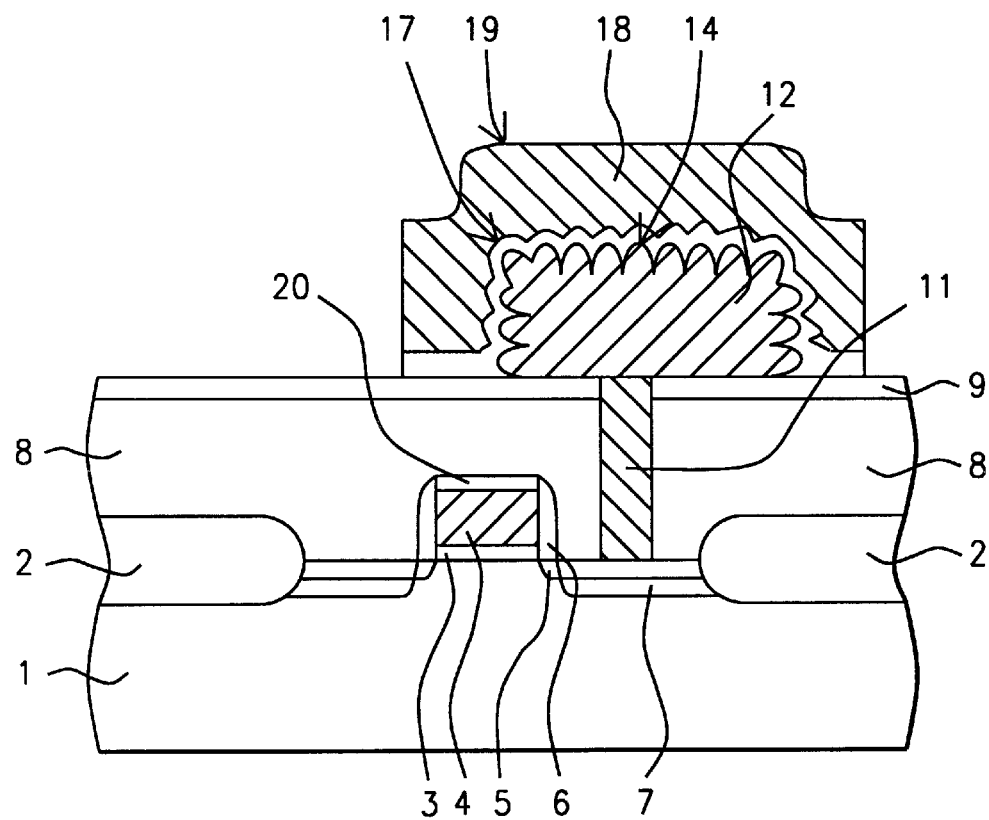

Finally a layer of polysilicon is deposited, via LPCVD procedures, to a thickness between about 1000 to 2000 Angstroms. Doping of this polysilicon layer is accomplished using an situ doping, deposition procedure, via the addition of phosphine to a silane, or disilane ambient. Photolithographic and RIE procedures, using $Cl_2$ as an etchant, are next employed to create polysilicon upper electrode, or plate electrode 18, shown schematically in FIG. 9. The photoresist shape, used for patterning of polysilicon upper electrode 18, is removed via plasma oxygen ashing and careful wet cleans, resulting in DRAM capacitor structure 19, comprised of polysilicon upper electrode 18, capacitor dielectric layer, 17, and a storage node electrode comprised of an HSG silicon layer on an amorphous silicon, storage node shape.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a capacitor structure, for a dynamic random access memory, (DRAM), device, on a semiconductor substrate, featuring a combination of process steps, such as a storage node shape, pre-clean procedure, deposition of hemispherical grain silicon, (HSG), seeds, annealing to convert said HSG silicon seeds to an HSG silicon layer, and deposition of a silicon nitride layer, all performed in situ, in a ultra high vacuum, (UHV), system, comprised the steps of:

providing an underlying transfer gate transistor, comprised of a gate structure, on a gate insulator layer, insulator spacers on the sides of said gate structure, and a source/drain region in an area of said semiconductor substrate, not covered by said gate structure;

forming a storage node contact hole, in a composite insulator layer, exposing the top surface of a source region;

forming a doped polysilicon plug, in said storage node contact hole;

forming said storage node shape, on the top surface of said composite insulator layer, and overlying, and contacting, the top surface of said doped polysilicon plug, with native oxide forming on exposed surfaces of said storage node shape;

removing a portion of said native oxide from said exposed surfaces of said storage node shape;

removing remaining portion of said native oxide from said exposed surfaces of said storage node shape, in said UHV system;

selectively depositing said HSG silicon seeds, on said exposed surfaces of said storage node shape, in situ, in said UHV system;

performing an anneal procedure, in situ, in said UHV system, to form a DRAM storage node electrode, comprised of said HSG silicon layer, on said storage node shape, with said HSG silicon layer formed via the reaction between said HSG silicon seeds and a top portion of said storage node shape;

depositing a silicon nitride layer, in situ, in said UHV system;

performing an oxidation procedure, creating a nitride—oxide, capacitor dielectric layer, comprised of a silicon oxide layer, on said silicon nitride layer, with said silicon oxide layer, formed via oxidation of a top portion of said silicon nitride layer; and forming an upper plate electrode, for said capacitor structure.

2. The method of claim 1, wherein said doped polysilicon plug is formed from a polysilicon layer, obtained using LPCVD procedures, to a thickness between about 1000 to 6000 Angstroms, and in situ doped during deposition, via the addition of phosphine or arsine, to a silane, or disilane ambient, resulting in a bulk concentration for said doped polysilicon plug between about 1E19 to 2E20 atoms/cm³.

3. The method of claim 1, wherein said storage node shape, is comprised of an amorphous silicon layer, obtained using LPCVD procedures, to a thickness between about 4000 to 15000 Angstroms, and in situ doped, during deposition, via the addition of arsine, or phosphine, to a silane, or disilane ambient, resulting in a bulk concentration, for said storage node shape, less than 6E20 atoms/cm³.

4. The method of claim 1, wherein said storage node shape is formed by patterning of an amorphous silicon layer, via an anisotropic RIE procedure, using $Cl_2$ as an etchant.

5. The method of claim 1, wherein said native oxide, on the surface of said storage node shape, is first removed using a DHF pre-clean procedure, and than any remaining native oxide is removed in said UHV system, via subjecting said storage node shape to a pressure below 1E-8 torr, at a temperature between about 500 to 800° C., for a time between about 1 to 60 min.

6. The method of claim 1, wherein said HSG silicon seeds are selectively formed on said storage node shape, in situ, in said UHV system, at a temperature between about 500 to 800° C., at a pressure less than 1.0 torr, for a time between about 1 to 60 min., using a silane or a disilane flow concentration below 1.0E-3 moles/m$^3$.

7. The method of claim 1, wherein said HSG silicon layer is formed, via reaction between said HSG silicon seeds, and the top portion of said storage node shape, as a result of an anneal procedure, performed in situ, in said UHV system, at a temperature between about 500 to 800° C., at a pressure of about 1.0E-8 torr, and for a time between about 0 to 120 min.

8. The method of claim 1, wherein said silicon nitride layer is deposited, in situ, in said UHV system, at a temperature between about 600 to 800° C., to a thickness between about 40 to 60 Angstroms.

9. The method of claim 1, wherein said nitride—oxide, capacitor dielectric layer, is formed via oxidation of the top portion of said silicon nitride layer, performed in a thermal system, at a temperature between about 700 to 1000° C., creating said silicon oxide layer, at a thickness between about 5 to 30 Angstroms, overlying said silicon nitride layer, now at a thickness between about 20 to 40 Angstroms.

10. A method of fabricating a DRAM capacitor structure, on a semiconductor substrate, in which a combination of process steps, featuring a high vacuum pre-clean of a storage node shape, deposition of hemispherical grain, (HSG), silicon seeds, an anneal cycle used to form a HSG silicon layer, and a silicon nitride deposition, are all performed in situ, in an ultra high vacuum, (UHV), system, is used to form a storage node structure for said DRAM capacitor structure, comprising the steps of:

providing an underlying transfer gate transistor, on said semiconductor substrate, comprised of a polysilicon gate structure, with insulator spacers on the sides of said polysilicon gate structure, overlying a silicon dioxide gate insulator layer, and a source/drain region, in an area of said semiconductor substrate, not covered by said gate structure;

depositing a composite insulator layer;

forming a storage node contact hole in said composite insulator layer, exposing the top surface of the source region, of said source/drain region;

depositing a doped polysilicon layer, completely filling said storage node contact hole;

removing said doped polysilicon layer, from the top surface of said composite insulator layer, forming a doped polysilicon plug, in said storage node contact hole;

depositing an amorphous silicon layer;

patterning of said amorphous silicon layer to form an amorphous silicon, storage node shape, overlying, and contacting, the top surface of said doped polysilicon plug, located in said storage node contact hole, with native oxide forming on exposed surfaces of said amorphous silicon, storage node shape;

performing a first pre-clean procedure, in a DHF solution, to remove a first portion of said native oxide from said exposed surfaces of said amorphous silicon, storage node shape;

performing a second pre-clean procedure, in said UHV system, at a pressure below 1E-8 torr, to remove any remaining portions of said native oxide from said exposed surfaces of said amorphous silicon, storage node shape;

selectively depositing said HSG silicon seeds, in situ, in said UHV system, on said exposed surfaces of said amorphous silicon, storage node shape;

performing an anneal procedure, in situ, in said UHV system, forming a DRAM storage node electrode, comprised of said HSG silicon layer, on said amorphous silicon, storage node shape, with said HSG silicon layer, formed during said anneal procedure, via the reaction between said HSG silicon seeds, with the top portion of said amorphous silicon, storage node shape;

depositing said silicon nitride layer, in situ, in said UHV system;

oxidizing the top surface of said silicon nitride layer, to create a capacitor dielectric layer, comprised of a silicon oxide layer, on the unoxidized portion of said silicon nitride layer;

depositing a polysilicon layer; and patterning of said polysilicon layer to form a polysilicon upper electrode, for said DRAM capacitor structure.

11. The method of claim 10, wherein said composite insulator layer is comprised of an underlying layer of either silicon oxide, or boro-phosphosilicate glass, obtained via LPCVD or PECVD procedures, at a thickness between about 1000 to 5000 Angstroms, and is comprised of an overlying layer of silicon nitride, obtained via LPCVD or PECVD procedures, to a thickness between about 50 to 1000 Angstroms.

12. The method of claim 10, wherein said doped polysilicon layer, used for said doped polysilicon plug, is obtained using LPCVD procedures, to a thickness between about 1000 to 6000 Angstroms, and doped in situ, during deposition, via the addition of arsine or phosphine, to a silane ambient, resulting in a surface concentration between, of said doped polysilicon layer, between about 1E19 to 2E20 atoms/cm$^3$.

13. The method of claim 10, wherein said amorphous silicon layer is deposited using LPCVD procedures, to a thickness between about 4000 to 15000 Angstroms, and doped in situ, during deposition, via the addition of phosphine, or arsine, to a silane, or to a disilane ambient, resulting in a bulk concentration for said amorphous silicon layer, less than 6E20 atoms/cm$^3$.

14. The method of claim 10, wherein said amorphous silicon, storage node shape, is formed via an anisotropic RIE procedure, applied to said amorphous silicon layer, using $Cl_2$ as an etchant.

15. The method of claim 10, wherein said second pre-clean procedure, accomplished in said UHV system, at a pressure below 1E-8 torr, is performed at a temperature between about 500 to 800° C., for a time between about 1 to 60 min.

16. The method of claim 10, wherein said HSG silicon seeds are selectively formed on the surface of said amorphous silicon, storage node shape, in situ, in said UHV system, at a temperature between about 500 to 800° C., at a pressure less than 1.0 torr, and for a time between about 1 to 60 min, using a silane, or a disilane flow, at a concentration below 1.0E-3 moles/m$^3$, in a nitrogen ambient.

17. The method of claim 10, wherein said anneal procedure, is performed in situ, in said UHV system, at a temperature between about 500 to 800° C., at a pressure of about 1.0E-8 torr, and for a time between about 0 to 120 min, resulting in the formation of said DRAM storage node electrode, comprised of said HSG silicon layer, on said amorphous silicon, storage node shape, and with said HSG silicon layer formed during said anneal procedure via the reaction between said HSG silicon seeds, and the top portion of said amorphous silicon, storage node shape.

18. The method of claim 10, wherein said silicon nitride layer is deposited, in situ, in UHV system, to a thickness between about 40 to 60 Angstroms.

19. The method of claim 1, wherein said silicon oxide layer is formed to a thickness between about 5 to 30 Angstroms, via an oxidation of a top portion of said silicon nitride layer.

\* \* \* \* \*